(12) United States Patent
Trumbo et al.

(10) Patent No.: US 7,679,537 B2
(45) Date of Patent: Mar. 16, 2010

(54) PRECISION MICROCONTROLLER-BASED PULSE WIDTH MODULATION DIGITAL-TO-ANALOG CONVERSION CIRCUIT AND METHOD

(75) Inventors: Dale Trumbo, Tucson, AZ (US); Alex Wedin, Tucson, AZ (US); Sam Fritzinger, Oro Valley, AZ (US)

(73) Assignee: Honeywell International Inc., Morristown, NJ (US)

( * ) Notice: Subject to any disclaimer, the term of this patent is extended or adjusted under 35 U.S.C. 154(b) by 86 days.

(21) Appl. No.: 12/017,096

(22) Filed: Jan. 21, 2008

(65) Prior Publication Data

US 2009/0184854 A1 Jul. 23, 2009

(51) Int. Cl.
*H03M 1/66* (2006.01)
(52) U.S. Cl. .................. 341/144; 341/118; 341/119; 341/120; 341/121; 341/143; 323/207; 323/210; 323/222; 323/285
(58) Field of Classification Search .................. 341/143, 341/144–154; 363/80, 81, 89; 323/207, 323/210, 222.285
See application file for complete search history.

(56) References Cited

U.S. PATENT DOCUMENTS

| | | | |
|---|---|---|---|
| 4,100,437 A | 7/1978 | Hoff, Jr. | |
| 4,761,725 A * | 8/1988 | Henze | 363/46 |
| 4,893,252 A | 1/1990 | Blumel | |
| 4,940,930 A | 7/1990 | Detweiler | |
| 5,373,292 A | 12/1994 | Yasuda | |
| 5,402,082 A | 3/1995 | Eccleston et al. | |
| 5,610,503 A | 3/1997 | Fogg et al. | |
| 5,612,609 A * | 3/1997 | Choi | 323/210 |
| 6,052,075 A | 4/2000 | Suzuki et al. | |
| 6,222,746 B1 * | 4/2001 | Kim | 363/89 |
| 6,232,964 B1 * | 5/2001 | Lee | 345/212 |
| 6,529,563 B1 | 3/2003 | Mosinskis et al. | |
| 6,696,884 B1 | 2/2004 | Seven | |
| 6,731,958 B1 | 5/2004 | Shirai | |
| RE39,274 E | 9/2006 | Hardee | |
| 7,129,745 B2 | 10/2006 | Lewis et al. | |
| 7,157,890 B1 * | 1/2007 | Kris | 323/272 |
| 7,221,133 B2 * | 5/2007 | Brown | 323/283 |
| 7,323,851 B2 * | 1/2008 | Markowski | 323/222 |
| 7,345,465 B2 * | 3/2008 | Dequina et al. | 323/316 |
| 2001/0040521 A1 | 11/2001 | Albinet et al. | |
| 2003/0090401 A1 * | 5/2003 | Yoshizawa | 341/152 |
| 2003/0209999 A1 * | 11/2003 | Hui et al. | 315/294 |
| 2004/0124910 A1 | 7/2004 | Chuang et al. | |
| 2005/0127886 A1 * | 6/2005 | Sase et al. | 323/282 |
| 2007/0112443 A1 * | 5/2007 | Latham et al. | 700/29 |
| 2007/0152734 A1 | 7/2007 | Senthinathan et al. | |
| 2009/0009096 A1 * | 1/2009 | Mojarradi et al. | 315/194 |

\* cited by examiner

*Primary Examiner*—Linh V Nguyen
(74) *Attorney, Agent, or Firm*—Ingrassia Fisher & Lorenz, P.C.

(57) ABSTRACT

A precision digital to analog conversion circuit and method are provided. A regulated direct current (DC) voltage having a DC voltage magnitude is supplied to a device, such as a processor. The processor generates a pulse width modulation (PWM) output signal based, at least in part, on the regulated DC voltage. An analog output signal is generated from the PWM output signal. The regulated DC voltage is compared to a precision reference DC voltage, the DC voltage magnitude is selectively adjusted based on the comparison.

12 Claims, 1 Drawing Sheet

PRECISION MICROCONTROLLER-BASED PULSE WIDTH MODULATION DIGITAL-TO-ANALOG CONVERSION CIRCUIT AND METHOD

TECHNICAL FIELD

The present invention generally relates to pulse width modulation (PWM) digital to analog conversion and, more particularly, to a circuit and method that provides increased accuracy for a microcontroller-based PWM digital to analog conversion.

BACKGROUND

Many modern systems are digitally-based systems, and thus implement various digital signal processing schemes. Nonetheless, many modern systems may also include one or more analog-based circuits, to process and supply one or more analog signals. Thus, such systems may include one or more digital-to-analog converter (DAC) circuits to convert digital signals to analog signals for use by the analog-based circuits.

Numerous and varied digital signal processing schemes, as well as numerous and varied digital to analog conversion schemes, have been developed. One type of digital signal processing scheme that is used is the well-known pulse width modulation (PWM) scheme. In systems that implement the PWM scheme, when digital to analog conversion is conducted on a PWM signal that is supplied from a processor, a buffer circuit that is powered by a precision reference is provided for each PWM signal output that undergoes the digital to analog conversion. This is done so to precisely control the output amplitude of the PWM signal, and thus provide the greatest possible accuracy.

Although the use of buffer circuits, as described above, provides sufficient accuracy and is a generally reliable paradigm, there are drawbacks associated with buffer circuit use. Namely, the buffer circuits can use up valuable circuit board space and/or can increase overall circuit and system costs.

Hence, there is a need for a circuit and method for conducting PWM digital to analog conversion that does not rely on buffer circuits (or other devices) that may take up inordinate circuit board space and/or that may decrease overall circuit and system costs, as compared to presently known circuits and systems. The present invention addresses one or more of these needs.

BRIEF SUMMARY

In one embodiment, and by way of example only, a digital-to-analog converter (DAC) circuit includes a processor, a DAC, a power supply, and a trim circuit. The processor is coupled to receive a regulated direct current (DC) voltage and is operable to at least selectively generate and supply a pulse width modulation (PWM) output signal. The DAC is coupled to receive the PWM output signal and is operable, in response thereto, to supply an analog output signal. The power supply is coupled to receive a voltage trim signal and is operable, in response thereto, to generate and supply the regulated DC voltage. The trim circuit is coupled to receive the regulated DC voltage and is operable, in response thereto, to supply the voltage trim signal to the power supply.

In yet another exemplary embodiment, a digital to analog conversion method includes supplying a regulated direct current (DC) voltage having a DC voltage magnitude. A pulse width modulation (PWM) output signal is generated based, at least in part, on the regulated DC voltage. An analog output signal is generated from the PWM output signal. The regulated DC voltage is compared to a precision reference DC voltage, the DC voltage magnitude is selectively adjusted based on the comparison.

Furthermore, other desirable features and characteristics of the DAC circuit and method will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
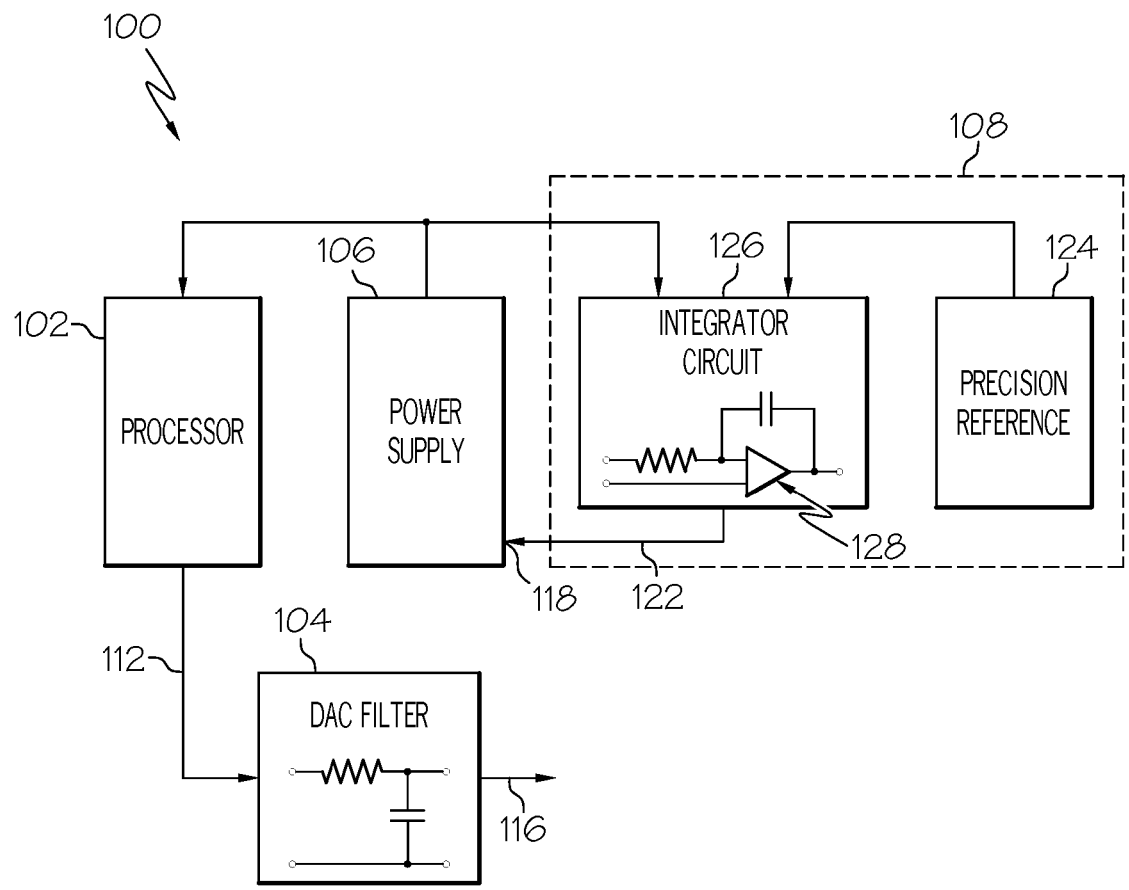
FIG. 1 depicts a block diagram of an exemplary digital to analog converter circuit according to the present invention.

A block diagram of an exemplary digital to analog converter circuit 100 is depicted in FIG. 1, and includes a processor 102, a digital-to-analog converter (DAC) 104, a power supply 106, and a trim circuit 108. The processor 102 is energized by the power supply 106 and is operable to at least generate and supply a pulse width modulation (PWM) output signal 112. As is generally known, PWM involves the modulation of the duty cycle of a signal to either convey information or control the amount of electrical power delivered to a load. The processor 102 may either pulse width modulate a separate input signal 114 (shown in phantom in FIG. 1) or it may pulse width modulate the power supplied to it from the power supply 106. It will be appreciated that the processor 102 may be implemented using any one of numerous suitable device, including any one of numerous suitable programmable microprocessors, digital signal processors, or microcontrollers. In one exemplary embodiment, in which the processor 102 is implemented using a microcontroller, the microcontroller may be, for example, the MPC566 device manufactured by Freescale Semiconductor, Inc. Though again, many other suitable devices may be used.

No matter how the processor 102 is specifically implemented, the PWM output signal 112 is supplied to the DAC 104. The DAC 104 is operable, in response to the PWM output signal 112, to supply an analog output signal 116 to one or more non-illustrated loads. More specifically, the DAC 104, using any one of numerous suitable digital to analog conversion techniques, converts the PWM output signal 112 to its analog equivalent and supplies it as the analog output signal 116. In the depicted embodiment, because the digital signal being converted is the PWM output signal 112, the DAC 104 is implemented as an analog low-pass filter circuit. It will be appreciated that numerous and varied low pass filter circuits may be used. In the depicted embodiment, however, the low pass filter is implemented as a resistor-capacitor (RC) type of low pass filter circuit.

As was alluded to above, the power supply 106 energizes the processor 102. More specifically, the power supply 106 is operable to generate and supply a regulated direct current (DC) voltage to the processor 102. It will be appreciated that the preferred magnitude of the regulated DC voltage supplied from the power supply 106 may vary, but in the depicted embodiment the DC voltage magnitude is +5 VDC. It will additionally be appreciated that any one of numerous regulated DC power supply circuits may be used to implement the power supply 106. In the depicted embodiment, for example, the power supply 106 is implemented using a TPS54550 step down converter manufactured by Texas Instruments.

Figure 2:
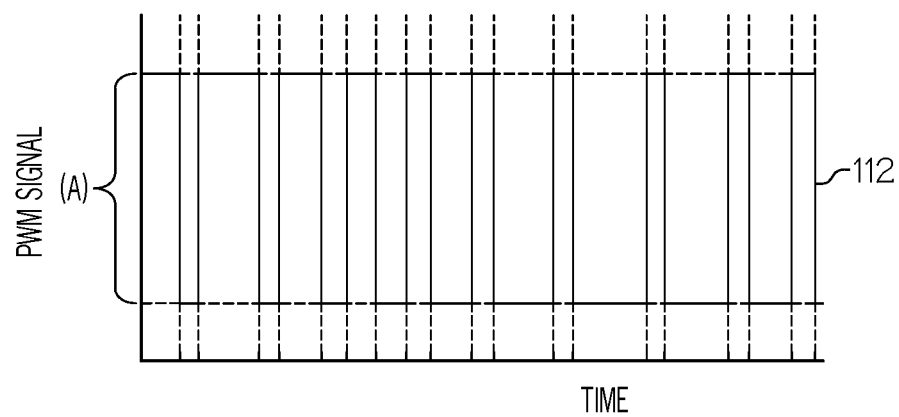
FIG. 2 depicts an exemplary pulse width modulation output signal that may be generated in the circuit of FIG. 1.

The PWM output signal 112 is a series of pulses, the duty cycles of which vary in order to convey information or control power delivery. Preferably, however, and as FIG. 2 depicts, the amplitude of each pulse is substantially constant (e.g., the PWM output signal 112 is a square wave), and the amplitude of each pulse is substantially equal in magnitude (e.g., the PWM output signal amplitude (A) is substantially constant in magnitude). Thus, the PWM output signal 112 is based, at least in part, on the regulated DC voltage supplied by the power supply 106. To ensure, with at least a suitable degree of accuracy, that the amplitude of the PWM output signal 112 is substantially constant in magnitude, the regulated DC voltage supplied by the power supply 106 is maintained relatively constant. In the depicted embodiment, and with reference once again to FIG. 1, it is seen that the power supply 106 includes a voltage sense input 118 that is coupled to receive a trim signal 122 from the trim circuit 108. The power supply 106 is responsive to the trim signal 122 to supply the regulated DC voltage.

The trim circuit 108, in addition to supplying the just-mentioned trim signal 122, is coupled to receive the regulated DC voltage supplied by the power supply 106. The trim circuit 108 senses the voltage magnitude of the regulated DC voltage supplied by the power supply 106. The trim circuit 108, in response to the sensed voltage magnitude, supplies a suitable trim signal to the power supply 106. As noted above, the power supply 106 is responsive to the trim signal 122 to maintain the regulated DC voltage at a relatively constant magnitude. Preferably, the trim signal 122 is limited authority and low bandwidth to avoid any loop stability issues. The trim circuit 108 may be variously implemented and variously configured. The exemplary implementation and configuration that is depicted in FIG. 1 will now be described in more detail.

The depicted trim circuit 108 includes a precision reference circuit 124 and an integrator circuit 126. The precision reference circuit 124 is operable to supply a precision DC reference voltage. That is, it is operable to supply a DC voltage at a desired, substantially constant and precise, reference voltage magnitude. Numerous circuits and devices are available to implement the precision reference circuit 124. An example of a suitable device that may be used to implement the precision reference circuit 124 is the REF195 voltage reference manufactured and sold by Analog Devices, Inc. This device supplies a nominal DC voltage output of +5 VDC at an accuracy of about ±2 mVDC maximum.

The integrator circuit 126 is coupled to receive the regulated DC voltage from the power supply 106 and the precision DC reference voltage from the precision reference circuit 124. The integrator circuit 126 is configured, in response to these two voltages, to supply the voltage trim signal 122 to the power supply 106. As with the other circuits and devices described herein, the integrator circuit 126 may be implemented and configured using any one of numerous suitable devices. In one particular embodiment, which is depicted in FIG. 1, the integrator circuit 126 is implemented using an operational amplifier 128, such as the OPA2131 general-purpose FET input operational amplifier manufactured and sold by Texas Instruments, configured as an integrator.

The digital to analog converter circuit 100 depicted in FIG. 1 and described above implements a precision DAC function. The power supply 106 and trim circuit 108 work together to supply the processor 102 with a suitably accurate regulated DC voltage. For example, when configured to supply +5 VDC, the power supply 106 and trim circuit 108 may supply the processor 102 with the +5 VDC at about 0.1% accuracy, which is sufficient to implement a precision DAC function.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A digital-to-analog converter (DAC) circuit, comprising:
   a processor coupled to receive a regulated direct current (DC) voltage and operable to at least selectively generate and supply a pulse width modulation (PWM) output signal;
   a DAC filter coupled to receive the PWM output signal and operable, in response thereto, to supply an analog output signal;
   a power supply coupled to receive a voltage trim signal and operable, in response thereto, to generate and supply the regulated DC voltage; and
   a trim circuit coupled to receive the regulated DC voltage and operable, in response thereto, to supply the voltage trim signal to the power supply, the trim circuit comprising:
      a precision reference circuit operable to supply a precision DC reference voltage; and
      an integrator circuit coupled to receive the regulated DC voltage and the precision DC reference voltage and operable, in response thereto, to supply the voltage trim signal.

2. The circuit of claim 1, wherein the DAC filter comprises a low-pass filter circuit.

3. The circuit of claim 2, wherein the low-pass filter circuit comprises a resistor-capacitor (RC) circuit.

4. The circuit of claim 1, wherein the integrator circuit comprises an operational amplifier.

5. The circuit of claim 1, wherein the processor comprises a microcontroller.

6. A digital-to-analog converter (DAC) circuit, comprising:
   a processor coupled to receive a regulated direct current (DC) voltage and operable to at least selectively generate and supply a pulse width modulation (PWM) output signal;
   a DAC filter coupled to receive the PWM output signal and operable, in response thereto, to supply an analog output signal;
   a power supply coupled to receive a voltage trim signal and operable, in response thereto, to generate and supply the regulated DC voltage; and
   a precision reference circuit operable to supply a precision DC reference voltage; and an integrator circuit coupled to receive the regulated DC voltage and the precision DC reference voltage and operable, in response thereto, to generate and supply the voltage trim signal.

7. The circuit of claim 6, wherein the DAC filter comprises a low-pass filter circuit.

8. The circuit of claim 7, wherein the low-pass filter circuit comprises a resistor-capacitor (RC) circuit.

9. The circuit of claim 6, wherein the integrator comprises an operational amplifier.

10. The circuit of claim 6, wherein the processor comprises a microcontroller.

11. A digital to analog conversion method, comprising the steps of:

supplying a regulated direct current (DC) voltage, the regulated DC voltage having a DC voltage magnitude;

generating a pulse width modulation (PWM) output signal based, at least in part, on the regulated DC voltage;

generating an analog output signal from the PWM output signal;

integrating differences between the regulated DC voltage and a precision reference DC voltage with respect to time;

generating a trim voltage from the integrated differences; and selectively adjusting the DC voltage magnitude in response to the generated trim voltage.

12. The method of claim 11, wherein the step of generating the analog output signal comprises low pass filtering the PWM output signal.

* * * * *